United States Patent [19]

Parks et al.

[11] 4,289,846
[45] Sep. 15, 1981

[54] PROCESS FOR FORMING LOW-REACTANCE INTERCONNECTIONS ON SEMICONDUCTORS

[75] Inventors: Earl L. Parks; Simon A. Zaidel, both of Liverpool, N.Y.

[73] Assignee: General Electric Company, Syracuse, N.Y.

[21] Appl. No.: 108,064

[22] Filed: Dec. 28, 1979

[51] Int. Cl.³ .......................................... H01L 21/288
[52] U.S. Cl. .................................... 430/314; 204/15; 427/89; 427/96; 427/57; 430/315; 430/329
[58] Field of Search .............. 427/89, 96, 57; 204/15; 430/314, 315, 329

[56] References Cited

U.S. PATENT DOCUMENTS

| | | | |
|---|---|---|---|
| 3,681,134 | 8/1972 | Nathanson et al. | 427/96 |
| 4,016,050 | 4/1977 | Lesh et al. | 204/15 |
| 4,054,484 | 10/1977 | Lesh | 427/89 |
| 4,141,055 | 2/1979 | Berry et al. | 427/96 |
| 4,200,975 | 5/1980 | Debiec et al. | 427/96 |

OTHER PUBLICATIONS

Semiconductor International, "Raytheon's 'Via Hole' Technology Yields Very Stable GaAs FETs", p. 14, Oct. 1977.

*Primary Examiner*—John D. Smith
*Attorney, Agent, or Firm*—Richard V. Lang; Carl W. Baker

[57] ABSTRACT

Several methods are disclosed for forming an air gap between crossing thin film conductors utilized to interconnect electronic components on a substrate. Each of the methods involves the use of photolithographic techniques to form overpassing conductors on a support material covering the overpassed conductors, followed by removal of the support material. Both deposition and plating techniques are described for forming the overpassing conductors.

3 Claims, 31 Drawing Figures

PROCESS FOR FORMING LOW-REACTANCE INTERCONNECTIONS ON SEMICONDUCTORS

BACKGROUND OF THE INVENTION

1. Field of the Invention

The invention relates to the formation of thin film conductive interconnections between electronic components and in particular to the formation of interconnections having negligible parasitic capacitance and inductance.

2. Description of the Prior Art

In semiconductor device fabrication it is often necessary to interconnect electronic components on a chip in such a manner as to minimize the parasitic reactance of the interconnection conductors. This is especially true when the chips are to be utilized in high frequency applications such as microwave amplifiers and digital processors.

To minimize capacitive reactance it is common practice to route the conductors so as to minimize the number of crossings thereof and to maximize the distance between crossing conductors by using an arched wire for the crossover conductor. This practice frequently results in circuitous routing of conductors, which uses up valuable chip area. Additionally, the arched wire is relatively thick in comparison with conductors that can be formed on the chip by thin film techniques and is a source of parasitic inductance.

One connection technique which results in low parasitic reactance of both types and makes efficient use of chip area is that of forming air bridges at crossover points. Thus, rather than routing conductors to avoid crossing, the thin film conductors on the chip are routed directly between the components to be interconnected thereby and these conductors are spaced from conductors which they cross by an air gap. Because of the low dielectric constant of air in comparison to the solid insulating materials normally used between crossing thin film conductors, the capacitance at these air-spaced crossovers is negligible.

Although this connection technique is generally known in the art, simple methods for forming high strength air bridges are not. It is therefore an object of the present invention to provide simple methods for forming such air bridges.

SUMMARY OF THE INVENTION

Each of the methods of the present invention involves utilization of photolithographic techniques for forming conductive bridges on a bridge support material covering conductors to be overpassed and all but small contact regions of selected conductors to which the bridges are to be connected. The support materials is subsequently removed to leave the bridges spaced by an air gap from the overpassed conductors.

In a first method a layer of bridge support material which resists etching by a first etching agent effective in the dissolution of the material utilized for forming the bridges is applied to both the conductors to be overpassed and those to be connected by the bridges. The bridge support material is then selectively removed by a photolithographic technique and an etching technique, employing a second etching agent, to uncover the contact regions of the selected conductors. A conductive bridge material which resists etching by the second agent is then deposited to the desired bridge thickness onto the bridge support material and the contact regions. A photolithographic technique is used to protect the bridge material spanning the contact regions, and the remainder of the bridge material and all of the bridge support material are removed by application of the first and second etching agents, respectively.

In a second method a layer of photosensitive material is applied to all conductors and is used as the bridge support material. The photosensitive material is selectively removed by a photolithographic technique to uncover the contact regions of the selected conductors and a conductive bridge material is deposited, to the desired bridge thickness, onto the photosensitive material and the contact regions. Photolithographic techniques are used to protect the bridge material spanning the contact regions and the remainder of the bridge material is removed by application of an etching agent. A solvent is then applied to remove the photosensitive material.

In a third method a layer of photosensitive support material is also applied to the conductors and is selectively removed to uncover the contact regions of the selected conductors. Conductive bridge material is deposited onto the support material and the contact regions only to a thickness sufficient to form an electroplating electrode. Using a photolithographic technique all of the electrode except that portion spanning the contact regions is covered with a second layer of photosensitive material. The uncovered electrode is electroplated to the desired bridge thickness and then all photosensitive material and the unplated electrode are removed.

In a fourth method a layer of conductive bridge support material, which is dissolvable in an etching agent which is ineffective in dissolving the bridge material to be supported thereby, is deposited onto the conductors. The bridge support material is then selectively removed by photolithographic and etching techniques to uncover the contact regions of the selected conductors. Again using photolithographic techniques, all of the bridge material except that spanning the contact regions is covered with a layer of photosensitive material. The contact regions and the uncovered bridge support material are then electroplated with conductive bridge material to the desired bridge thickness. The remaining photosensitive material and the bridge support material are removed by application of a solvent and the etching agent, respectively.

DESCRIPTION OF THE PREFERRED EMBODIMENTS

Figure 1A:
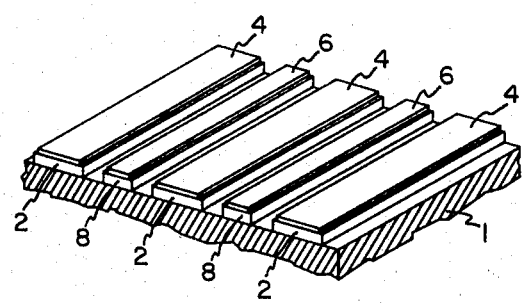
FIGS. 1A through 1H schematically illustrate a first method of performing the invention.
Figure 1E:
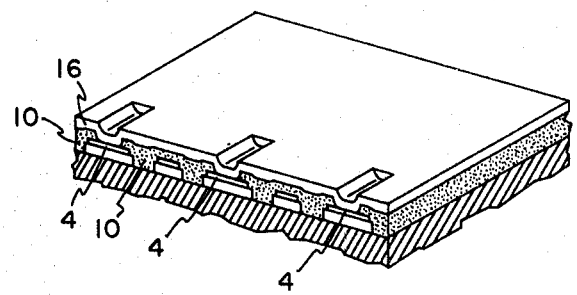
Figure 1B:
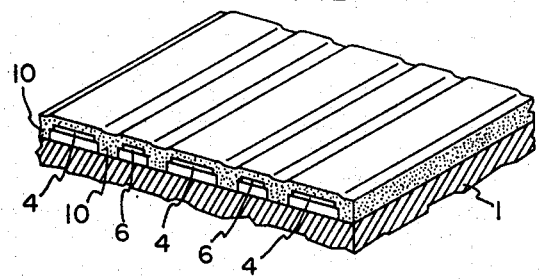
Figure 1F:
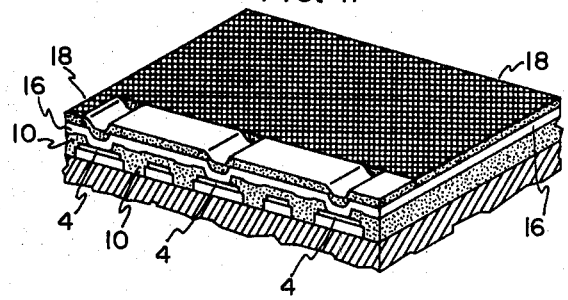
Figure 1C:
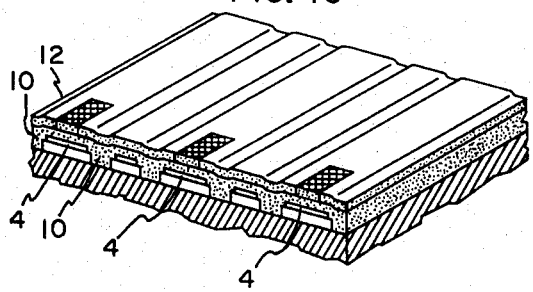
Figure 1G:
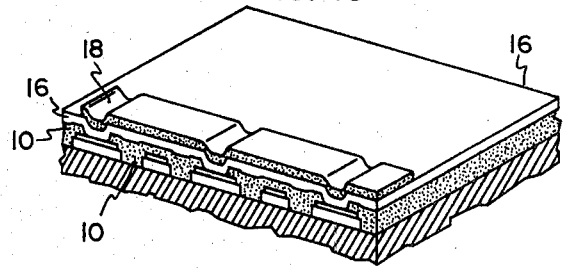

The four described methods of performing the invention are illustrated in FIGS. 1 through 4, respectively. FIGS. 1A, 2A, 3A and 4A each depict a section of a typical chip comprising a substrate 1 on which a plurality of semiconductor components have been formed by well known thin film techniques. The substrate can be any material satisfactory for thin film deposition techniques, but in this example a sapphire substrate is used.

Portions of islands 2 carrying selected conductors 4 which are to be connected are illustrated. The conductors 4 typically lead to electrodes of active and passive semiconductor devices (not shown) to be connected. For purposes of illustration it will be assumed that an air bridge connecting the conductors 4 is to pass over conductors 6 lying on islands 8. The conductors 6 typically connect electrodes of semiconductor devices to pads which are used for connecting the chip to external circuitry.

Each of the four methods will be described in conjunction with its illustrative drawing figures and a table following the description which lists some specific materials utilizable in each step, along with nominal thicknesses thereof. It is to be understood that the drawing figures are not to scale and that some of the dimensions are greatly exaggerated to accommodate the great range of layer thicknesses encountered in each method. It is also to be understood that the materials listed are not all-inclusive and that the thicknesses thereof are not critical. Rather they will be determined by the specific chip configuration and in accordance with the guidelines given in the descriptions of the methods.

METHOD 1

This method, which involves the use of photolithographic and etching techniques includes the following steps:

1. (FIG. 1B) A layer of bridge support material 10 is deposited onto the conductors 4, 6 and the substrate 1. The thickness of the layer should be equal to the desired height of the bridges above the substrate 1 and the conductors 6 to be overpassed. The type of support material chosen should be one which resists etching by a first etching agent effective in the dissolution of the conductive material utilized to form the bridges, but which dissolves in a second etching agent which is ineffective for etching the bridge material.

2. (FIG. 1C) A layer of photosensitive material 12 is applied to the bridge support material 10. The layer should be of sufficient thickness to protect the support material covered thereby against etching.

3. By using well known photomasking techniques, the photosensitive material 12 above contact regions of the selected conductors with which the bridge is to come in contact is exposed and developed to effect uncovering of the bridge support material 10 located above each of the contact regions. The material removed by developing is indicated by crosshatching.

4. The second etching agent is applied to the uncovered bridge support material 10 to effect removal thereof and uncovering of the contact regions of the conductors 4.

Figure 1D:
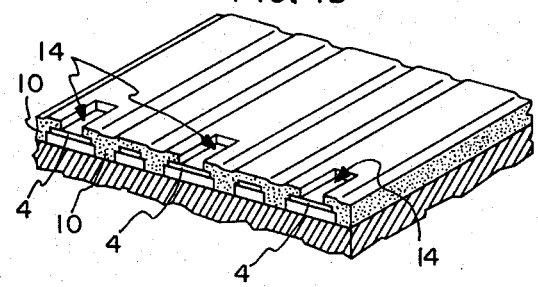

5. A solvent is applied to the remaining photosensitive material 12 to effect removal thereof, leaving only the bridge support material 10 covering the conductors 4, 6 and the substrate 1 (FIG. 1D). Openings formed in the bridge support material by application of the second etching agent, to uncover the contact regions of the selected conductors 4 are shown at 14.

6. (FIG. 1E) Utilizing a deposition technique such as vacuum deposition or sputtering a layer of conductive bridge material 16 is deposited onto the remaining bridge support material 10 and onto the contact regions of the selected conductors 4. The layer should be of the desired bridge thickness.

7. (FIG. 1F) A layer of photosensitive material 18 is applied to the conductive bridge material 16. This layer should be of sufficient thickness to protect the bridge material covered thereby against etching.

8. (FIG. 1F) Again using photomasking techniques all of the photosensitive material 18, except that spanning the contact regions of the selected conductors 4, is exposed and developed (as indicated by crosshatching). This development effects removal of the photosensitive material covering the bridge material 16 in the areas where bridging is not desired.

9. (FIG. 1G) The first etching agent is applied to the uncovered bridge material 16 effecting removal thereof.

10. (FIG. 1G) A solvent is applied to the remaining photosensitive material 18 to effect removal thereof.

11. (FIG. 1G) The second etching agent is applied to the bridge support material 10 to effect removal thereof.

Figure 1H:
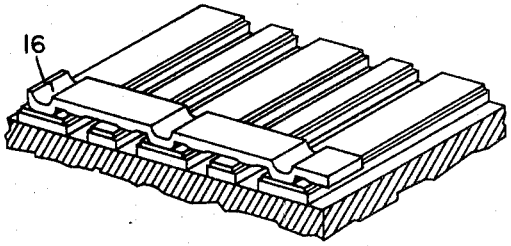

The finished bridge produced by Method 1 is illustrated in FIG. 1H. Note the air gaps between the conductive bridge 16 and the overpassed conductors 6 from which capacitive isolation is desired.

TABLE 1

| Ident. Number | Nominal Thickness | Material | Etching Agent | Developer | Solvent |
| --- | --- | --- | --- | --- | --- |
| 10 | 2 μm | Titanium | Fluoboric Acid | | |
| 10 | 2 μm | Polyimide | Sulfuric Acid | | |
| 12 | 1 μm | Shipley A-Z 1315J Photoresist | | Shipley AZ-606 | Acetone |
| 16 | 1 μm | Gold | Potassium Iodide | | |
| 16 | 1 μm | Platinum | Aqua Regia | | |
| 18 | 1 μm | Shipley A-Z 1315J Photoresist | | Shipley AZ-606 | Acetone |

METHOD 2

This method also involves the use of photolithographic and etching techniques. It includes the following steps:

1. (FIG. 2B) A layer of photosensitive material 20 is applied to the conductors 4, 6 and the substrate 1. The layer should be of a thickness equal to the desired height of the bridge above the substrate 1 and the conductors 6 to be overpassed.

2. (FIG. 2B) By use of well known photomasking techniques the photosensitive material 20 above the contact regions of the selected conductors 4 is exposed and developed to effect removal of the exposed material and uncovering of the surface of each of these regions. The material removed by developing is indicated by crosshatching.

3. (FIG. 2C) Utilizing a deposition technique such as vacuum deposition or sputtering a layer of conductive bridge material 22 is deposited onto the remaining photosensitive material 20 and onto the uncovered contact regions of the conductors 4. The layer should be of the desired bridge thickness.

4. (FIG. 2D) A layer of photosensitive material 24 is applied to the conductive bridge material 22. This layer should be of sufficient thickness to protect the bridge material covered thereby against etching.

5. (FIG. 2D) Again using photomasking techniques, all of the photosensitive material 24 except that spanning the contact regions is exposed and developed (as indicated by crosshatching). This development effects removal of the crosshatched material 24 and uncovering of the bridge material 22 in the areas where bridging is not desired.

6. (FIG. 2E) An etching solution is applied to the uncovered bridge material 22 to effect removal thereof.

7. (FIG. 2E) A solvent is applied to the remaining photosensitive material 20 and 24 to effect removal thereof.

Figure 2A:
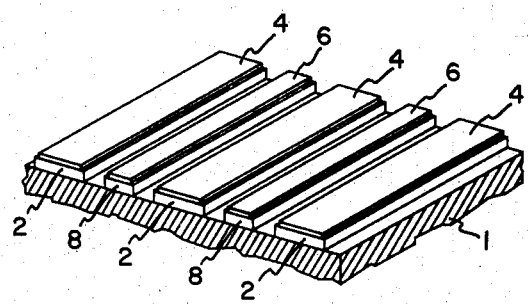
FIGS. 2A through 2F schematically illustrate a second method for performing the invention.
Figure 2B:
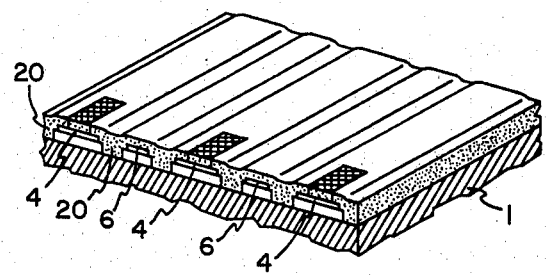
Figure 2C:
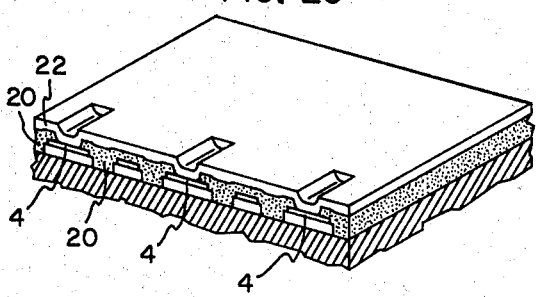
Figure 2D:
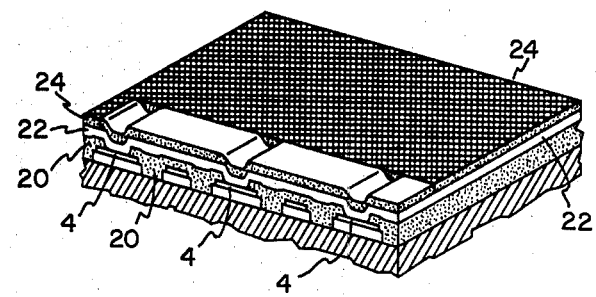
Figure 2E:
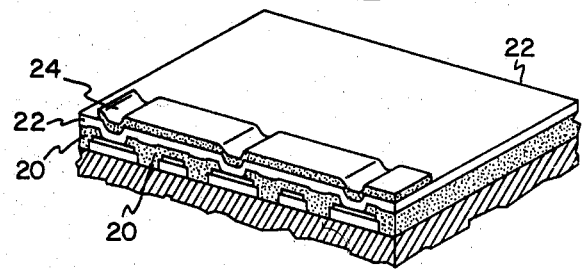
Figure 2F:
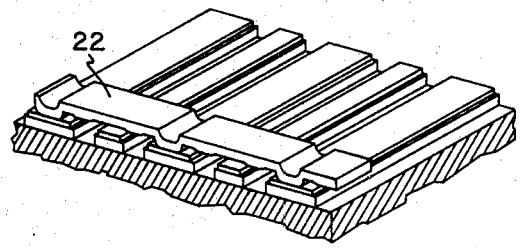

The finished bridge produced by Method 2 is illustrated in FIG. 2F. This method is less complex than Method 1 because only one etching solution is required and fewer steps are involved. Nevertheless, Method 2 produces crossover bridges having the same thin film dimensions and low reactance characteristics as the bridges produced by Method 1.

TABLE 2

| Ident. Number | Nominal Thickness | Material | Etching Agent | Developer | Solvent |
|---|---|---|---|---|---|
| 20 | 2 μm | Shipley A-Z 1315 J Photoresist | | Shipley AZ-606 | Acetone |
| 22 | 1 μm | Gold | Potassium Iodide | | |
| 22 | 1 μm | Platinum | Aqua Regia | | |
| 24 | 1 μm | Shipley A-Z 1315J Photoresist | | Shipley AZ-606 | Acetone |

METHOD 3

This method, which involves the use of photolithographic and electroplating techniques, includes the following steps.

1. (FIG. 3B) A layer of photosensitive material 30 is applied to the conductors 4, 6 and the substrate 1. The layer should be of a thickness equal to the desired height of the bridges above the substrate 1 and the conductors to be overpassed 6.

2. (FIG. 3B) By the use of well-known photomasking techniques, the photosensitive material 30 above the contact regions of the selected conductors 4 is exposed and developed to effect removal of the exposed material and uncovering of the surface of each of these regions. The material removed by developing is indicated by crosshatching.

3. (FIG. 3C) A layer of conductive material 32 is deposited onto the remaining photosensitive material 30 and the contact regions of the conductors 4. The layer should be of sufficient thickness to form an electroplating electrode and can be effectively deposited by such standard techniques as sputtering and vacuum deposition.

4. (FIG. 3D) A layer of photosensitive material 34 is applied onto the layer of conductive material 32. This layer should be of sufficient thickness to ensure that no defects such as pinholes exist, through which the conductive material covered thereby could be plated.

5. (FIG. 3D) Again using photomasking techniques, the photosensitive material 34 above the conductive material 32 spanning the contact regions of conductors 4 is exposed and developed (as indicated by crosshatching). The crosshatched material is removed by the development thus uncovering the conductive material 32 to be electroplated. A portion of the photosensitive material 34 near the edge of the wafer is also removed to uncover a contact portion of the conductive material for making an electrical connection.

6. The wafer is immersed in an electroplating solution containing a conductive material which forms a strong bond with conductive material 32. The uncovered contact portion of the conductive material 32 is connected to the source of potential utilized for electroplating to effect utilization of layer 32 as one electrode. The particular solution utilized will determine whether layer 32 is connected as the cathode or the anode. The area of the other electrode and the magnitude of the plating current should be selected such that plating to the desired thickness is accomplished prior to deterioration of the photosensitive layer 34 (which tends to flake off at the high temperatures [typically 100° C.] at which the plating solution is maintained). The rate of plating can not be too high, however, or the plating material will not form a strong bond with conductive layer 32. In one test run good results were obtained by utilizing a plating current of approximately 5 milliamps and an anode of 5 cm diameter to plate gold on a gold layered wafer of approximately the same diameter. The resulting bridge is illustrated at 36 in FIG. 3E.

Two different processes will now be described for removing the remaining photosensitive material 30, 34 and the unplated conductive material 32. The first of these processes, which involves an etching technique, is described in steps 7A through 11A. The second process, which involves a vibration technique, is described in steps 7B through 9B.

Figure 3A:
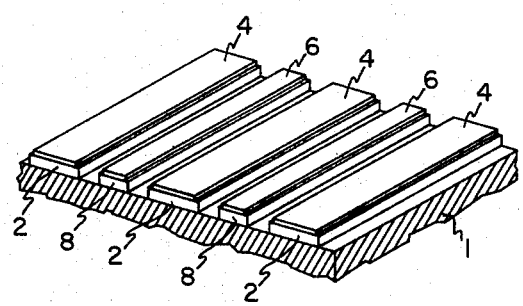
FIGS. 3A through 3I schematically illustrate a third method for performing the invention.
Figure 3F:
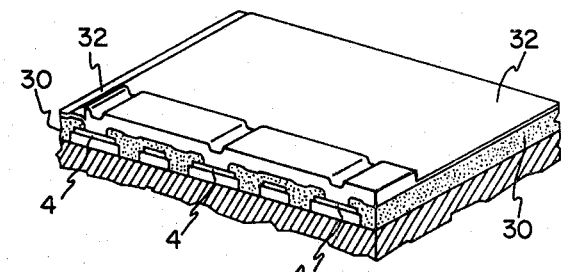
Figure 3B:
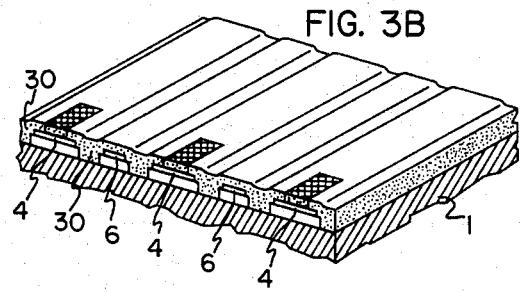
Figure 3G:
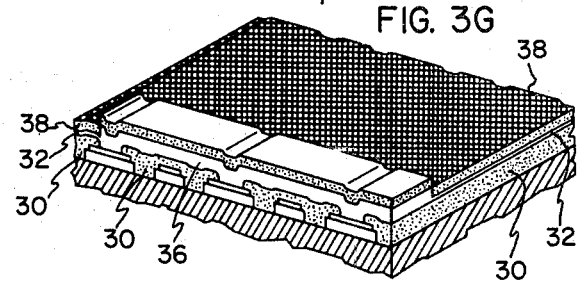
Figure 3C:
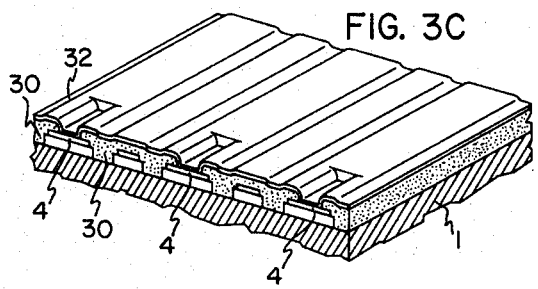
Figure 3H:
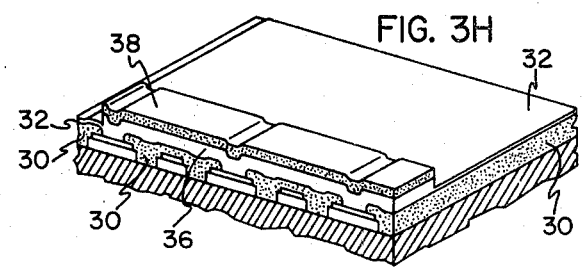
Figure 3D:
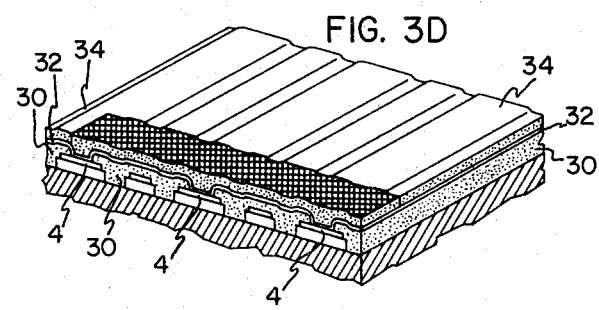
Figure 3I:
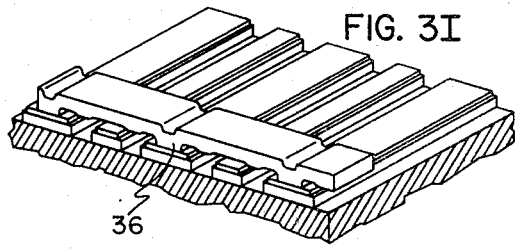
Figure 3E:
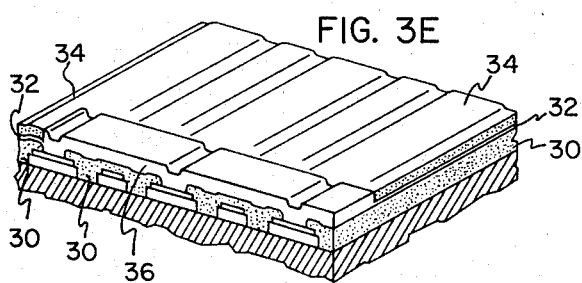

ETCHING REMOVAL PROCESS 7A (FIG. 3E). A solvent is applied to the remainder of photosensitive layer 34 to effect removal thereof. The resulting layer configuration is illustrated in FIG. 3F. 8A (FIG. 3G) A layer of photosensitive material 38 is applied to both the unplated conductive material 32 and the bridge 36. This layer should be of sufficient thickness to protect the bridge against an etching agent which will be subsequently applied to remove the unplated conductive material 32. 9A (FIG. 3G) Using standard photomasking techniques all of the photosensitive material 38 lying above the unplated conductive material 32 is exposed and developed. Removal of the developed material (indicated by crosshatching) uncovers all of the unplated conductive material 32.

10A (FIG. 3H) An etching agent is applied to the uncovered conductive material 32 to effect removal thereof.

11A (FIG. 3H) A solvent is applied to remove the remaining layers 30, 38 of the photosensitive material.

VIBRATION REMOVAL PROCESS 7B. (FIG. 3E) A solvent is applied to the remainder of photosensitive layer 34 to effect removal thereof.

8B. (FIG. 3F) The wafer is immersed in an ultrasonic bath and vibrated to remove the unplated conductive material 32. The strong bond between the conductive bridge 36 and conductors 4 prevents separation thereof, but only a relatively weak bond exists between layers 30 and 32.

9B. (FIG. 3F) A solvent is applied to the remaining photosensitive material 30 to effect removal thereof.

The finished bridge produced by Method 3 is illustrated in FIG. 3I. The use of the electroplating technique results in a bridge with rounded edges giving it great strength and high resistance to vibrational separation. A further advantage of this method is minimization of the amount of waste conductive material, because the unplated conductive layer 32 which is removed need only be thick enough to form an electrode.

TABLE 3

| Ident. Number | Nominal Thickness | Material | Etching Agent | Developer | Solvent |
|---|---|---|---|---|---|
| 30 | 2 μm | Shipley A-Z 1315J Photoresist | | Shipley AZ-606 | Acetone |
| 32 | 500A | Gold | Potassium Iodide | | |
| 32 | 500A | Platinum | Aqua Regia | | |
| 34 | 1 μm | Shipley A-Z 1315J Photoresist | | Shipley AZ-606 | Acetone |
| 36 | 1 μm | Gold | Potassium Iodide | | |
| 36 | 1 μm | Platinum | Aqua Regia | | |
| 38 | 1 μm | Shipley A-Z 1315J Photoresist | | Shipley AZ-606 | Acetone |

METHOD 4

This method involves the use of both photolithographic and electroplating techniques. It includes the following steps:

1. (FIG. 4B) A layer of conductive bridge support material 40 is deposited onto the conductors 4, 6 and the substrate 1. The thickness of the layer should equal the desired height of the bridge above the substrate and the conductors 6 to be overpassed. The type of support material chosen should be a conductive material which is dissolvable in an etching agent which is ineffective in the dissolution of the conductive material utilized to form the bridges.

Figure 4A:
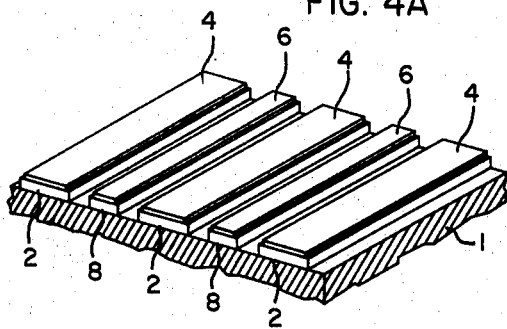
FIGS. 4A through 4H schematically illustrate a fourth method for performing the invention.
Figure 4E:
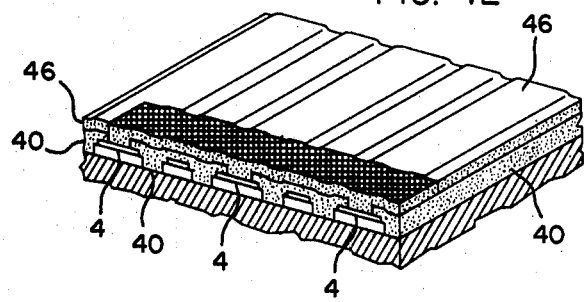
Figure 4B:
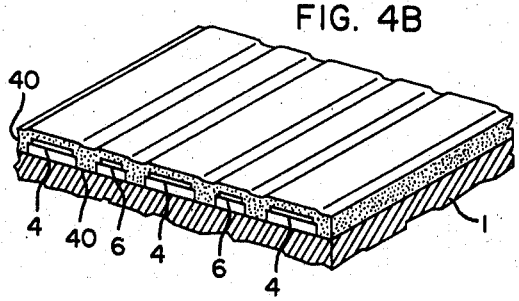
Figure 4F:
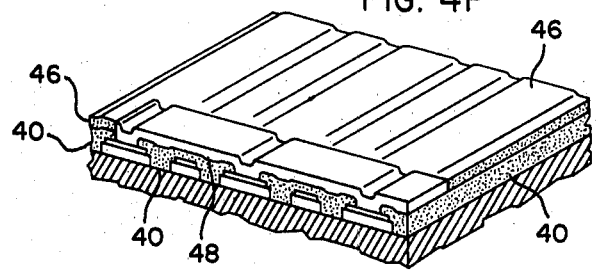
Figure 4C:
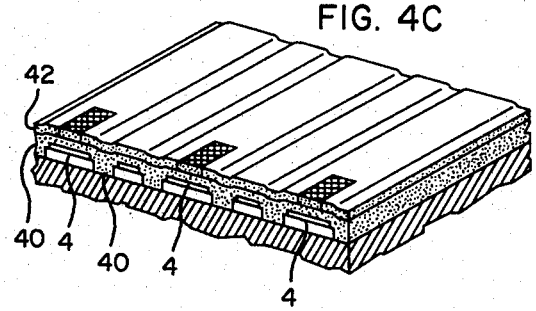
Figure 4G:
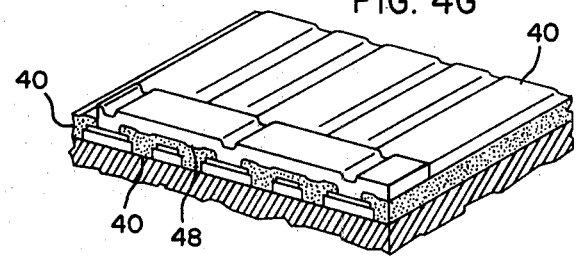

2. (FIG. 4C). A layer of photosensitive material 42 is applied to the bridge support material 40. The layer should be of sufficient thickness to protect the support material covered thereby against etching.

3. (FIG. 4C) By use of well known photomasking techniques, the photosensitive material 42 above the contact regions of conductors 4 is exposed and developed to effect uncovering of the bridge support material 40 located above each of the contact regions. The material removed by developing is indicated by crosshatching.

4. The etching agent is applied to the uncovered bridge support material 40 to effect removal thereof and uncovering of the contact regions of the conductors 4.

Figure 4D:
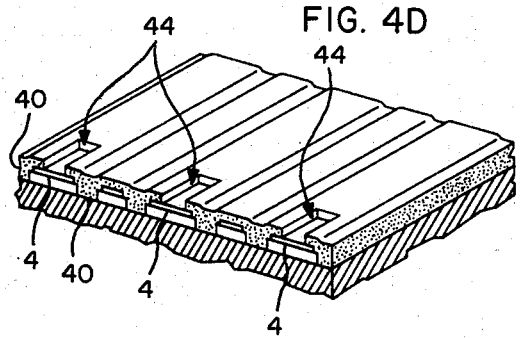

5. A solvent is applied to the remaining photosensitive material 42 to effect removal thereof, leaving only the bridge support material 40 covering the conductors 46, and the substrate 1 (FIG. 4D). Openings formed in the bridge support material by application of the etching agent, to uncover the contact regions of the selected conductors 4, are shown at 44.

6. (FIG. 4E) A layer of photosensitive material 4, 6 is applied to the conductive bridge support material 40 and the contact regions of the conductors 4.

7. (FIG. 4E). Again using photomasking techniques, the photosensitive material 46 above the contact regions and the conductive support material 40 spanning the contact regions is exposed and developed. The crosshatched material is removed by the development, thus uncovering conductive contact regions and support material which will be used jointly as an electroplating electrode. A portion of the photosensitive material near the edge of the wafer is also removed to uncover a contact portion of the conductive support material for making an electrical connection.

8. The wafer is immersed in an electroplating solution containing a conductive material which readily plates onto the support material and the conductors 4, but which forms a strong bond only with the contact regions of the conductors 4. The uncovered contact portion of the conductive support material 40 is connected to the source of potential used for electroplating to effect utilization of the electrode formed by the conductive contact regions and support material. The criteria for determining the polarity and area of the electrodes and the magnitude of the plating current are the same as those utilized in Method 3. The resulting bridge is illustrated at 44 in FIG. 4F.

9. (FIG. 4F) A solvent is applied to the remaining photosensitive material 46 to effect removal thereof.

10. (FIG. 4G) The etching agent is applied to the remaining bridge support material 40 effecting removal thereof.

Figure 4H:
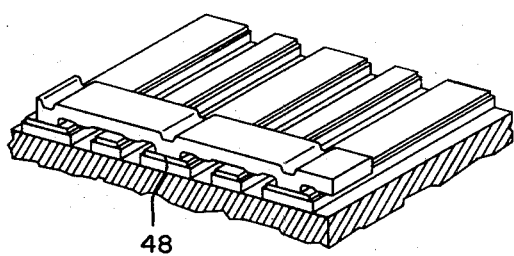

The finished bridge produced by Method 4 is illustrated in FIG. 4H. The bridge has the same structural and electrical characteristics as that produced by Method 3, but Method 4 requires fewer steps and none of the conductive bridge material is wasted.

TABLE 4

| Ident. Number | Nominal Thickness | Material | Etching Agent | Developer | Solvent |
|---|---|---|---|---|---|
| 40 | 2 μm | Titanium | Fluoboric Acid | | |
| 42 | 1 μm | Shipley A-Z 1315J Photoresist | | Shipley AZ-606 | Acetone |
| 46 | 1 μm | Shipley A-Z 1315J Photoresist | | Shipley AZ-606 | Acetone |
| 48 | 1 μm | Gold | | none needed | |
| 48 | 1 μm | Titanium | | none needed | |

Thus, in accordance with the present invention, methods have been provided for forming low reactance, thin film conductive bridges. Although the invention has been described by a series of specific steps for each method, it is to be understood that variations in these steps are also within the scope of the invention as described by the appended claims. For example, the removal of photosensitive material from the wafer can be accomplished by use of a plasma rather than a solvent. Also, the materials utilized in each method need not be limited to those listed in the accompanying tables, but can be any materials meeting the criteria set forth in the individual methods.

We claim:

1. A method of forming a conductive bridge connecting selected ones of a plurality of thin film conductors located on a substrate comprising:

A. applying a layer of photosensitive material to the conductors and the substrate, said layer being of a thickness equal to the desired height of the bridges;

B. selectively exposing and developing the photosensitive material to effect uncovering of a contact region of each of the selected conductors with which the bridge is to come in contact;

C. depositing a layer of conductive material onto the photosensitive material and the contact regions, said layer being of sufficient thickness to form an electroplating electrode;

D. applying a layer of photosensitive material onto the layer of conductive material, said layer being of sufficient thickness to prevent electroplating therethrough;

E. selectively exposing and developing the last applied layer of photosensitive material to effect uncovering of the conductive material spanning the contact regions;

F. utilizing the conductive material as an electrode and electroplating the uncovered surface areas thereof to the desired bridge thickness to form the bridge; and G. removing the remaining photosensitive material and the unplated conductive material.

2. A method as in claim 1 where said remaining photosensitive material and said unplated bridge material is removed by the steps of:

A. applying a solvent to the remainder of the last applied layer of photosensitive material to effect removal thereof;

B. applying a layer of photosensitive material onto the bridge, said layer being of sufficient thickness to prevent etching of the bridge;

C. selectively exposing and developing the last applied layer of photosensitive material to effect uncovering of the unplated conductive material;

D. applying an etching agent to the unplated conductive material to effect removal thereof; and E. applying a solvent to the remaining photosensitive material to effect removal thereof.

3. A method as in claim 1 where said remaining photosensitive material and said unplated conductive material is removed by:

A. applying a solvent to the remainder of the last applied layer of photosensitive material to effect removal thereof;

B. ultrasonically vibrating the unplated conductive material to effect removal thereof;

C. applying solvent to the remaining photosensitive material to effect removal thereof.

* * * * *